United States Patent [19]

Skoultchi

[11] Patent Number: 5,376,746
[45] Date of Patent: Dec. 27, 1994

[54] ACRYLIC ADHESIVE COMPOSITION AND ORGANOBORON INITIATOR SYSTEM

[75] Inventor: Martin M. Skoultchi, Somerset, N.J.

[73] Assignee: National Starch and Chemical Investment Holding Corporation, Wilmington, Del.

[21] Appl. No.: 137,855

[22] Filed: Oct. 15, 1993

Related U.S. Application Data

[62] Division of Ser. No. 852,855, Mar. 19, 1992, Pat. No. 5,286,821.

[51] Int. Cl.$^5$ .......................... C08F 4/52; C07F 5/02; C07C 47/00
[52] U.S. Cl. .................................. 526/196; 526/197; 526/198; 526/208; 526/230; 525/939; 564/8; 564/9; 568/1; 568/420
[58] Field of Search ............... 526/197, 198, 208, 230; 525/939; 564/8, 9; 568/1, 420, 425

[56] References Cited

U.S. PATENT DOCUMENTS

| | | | |
|---|---|---|---|
| 3,275,611 | 9/1966 | Mottus et al. | 260/80.5 |
| 3,616,040 | 10/1971 | Toback | 526/320 |
| 4,404,345 | 9/1983 | Janssen | 526/208 |
| 4,602,073 | 7/1986 | Skoultchi et al. | 526/208 |
| 5,106,928 | 4/1992 | Skoultchi et al. | 526/196 |

OTHER PUBLICATIONS

S. Fujisawa et al., Chem Abstracts 88532r, vol. 73 (1970).
"Physical Properties of Aldehydes and Kentones", Modern Organic Chemistry by Roberts et al. p. 315, W. A. Benjamin, Inc. N.Y., 1967.

*Primary Examiner*—Tae H. Yoon
*Attorney, Agent, or Firm*—Eugene Zagarella, Jr.

[57] ABSTRACT

A two-part initiator system useful in acrylic adhesive compositions comprising in one part a stable organoboron amine complex and in the second part an aldehyde destabilizer or activator. This initiator is particularly useful in elastomeric acrylic adhesive compositions and provides room temperature, relatively slow curing systems with good adhesive properties making them useful in applications where longer open times are required.

7 Claims, No Drawings

ACRYLIC ADHESIVE COMPOSITION AND ORGANOBORON INITIATOR SYSTEM

This application is a division of application Ser. No. 07/852,855 filed Mar. 17, 1992, now U.S. Pat. No. 5,286,821.

BACKGROUND OF THE INVENTION

This invention relates to a novel organoboron complex initiator system and an acrylic adhesive composition containing this initiator. More particularly this invention involves a two-part initiator system comprising in one part a stable organoboron amine complex and in the second part an aldehyde destabilizer or activator. This initiator system is especially useful in elastomeric acrylic adhesive compositions and provides a room temperature, relatively slow curing system with good adhesive properties.

Adhesive compositions including acrylic adhesives such as solutions of elastomeric polymers in soluble polymerizable acrylic or methacrylic monomers are well known in the art. These compositions which are especially known for their toughening properties generally include a redox system which comprises a catalyst or initiator, an accelerator and an activator to initiate cure, as well as other additives such as adhesion promotors, chelators, cross-linking agents, thickeners and plasticizers. Two-part acrylic adhesives where an activator is added as a separate second component are widely used and are known for curing speed as well as toughness. The catalyst or initiator typically used in these adhesives are free-radical initiators of the organic peroxy or hydroperoxy type, perester or peracid type.

Many known adhesive systems, such as the epoxies, require a thermal cure to obtain desirable properties, while other that do not, usually require prolonged cure times.

Boron amine complexes have been utilized in catalyst systems to polymerize olefin compounds as disclosed in U.S. Pat. No. 3,275,611 issued on Sep. 27, 1966 to E. H. Mottus, et al. The use of boron amine complexes as a dental adhesive has been disclosed in a publication to S. Fujisawa, et al., Chem. Abstracts 88532r, Vol. 73 (1970) where an amine acceptor such as an isocyanate acid chloride, or sulfonyl chloride is added to reactivate the initiator. Further use of boron amine complexes in adhesive compositions has been disclosed in copending application Ser. No. 07/692,766 filed Apr. 29, 1991 now U.S. Pat. No. 5,106,928, where an organic acid destabilizer or activator is added to the composition. These systems provide relatively fast curing compositions while the organoboron aminealdehyde initiator containing compositions of this invention cure at room temperature at a somewhat slower curing rate making them particularly useful in applications where longer open times are required.

SUMMARY OF THE INVENTION

This invention involves a novel two-part organoboron amine complex initiating system useful in elastomeric acrylic adhesives compositions to provide better room temperature curing at desired cure rates thereof.

The organoboron initiating system of this invention is a two-part system comprising:

A) a stabilized organoboron amine complex of the formula:

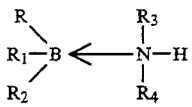

where R, $R_1$ and $R_2$ are alkyl of 1 to 10 carbon atoms or phenyl, $R_3$ and $R_4$ are hydrogen or alkyl of 1 to 10 carbon atoms, or

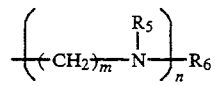

or

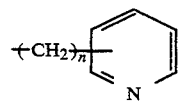

where $R_5$ and $R_6$ are hydrogen or alkyl of 1 to 10 carbon atoms, m is 2 to 10 and n is 1 to 6, and B) an aldehyde activator having the formula:

$$R\text{-}(CHO)_x$$

where R is alkyl of 1 to 10 carbon atoms or aryl of 6 to 10 carbon atoms and x is 1 to 2.

DETAILED DESCRIPTION OF THE INVENTION

The stabilized organoboron amine complex of the structure (I) which comprises one part of the initiator of this invention is made by combining an organoboron compound with a primary or secondary amine or polyamine containing primary or secondary amines. The organoboron compound has the formula:

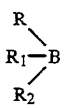

where R, $R_1$ and $R_2$ are alkyl of 1 to 10 carbon atoms or phenyl, preferably alkyl of 1 to 4 carbons. In this formula, the alkyl groups may be straight or branch chained and the phenyl group may contain substituents such as alkyl, alkoxy or halogen. Illustrative compounds of this type include, e.g., trimethylboron, triethylboron, tri-n-butylboron, tri-sec-butylboron and tri-isobutylboron.

The amine which is used in forming the organoboron amine complex (I) may be any primary or secondary amine or polyamine containing a primary or secondary amine, or ammonia and having the following formula:

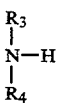

where $R_3$ and $R_4$ are hydrogen or alkyl of 1 to 10 carbon atoms, or

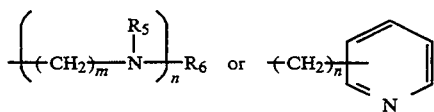

where $R_5$ and $R_6$ are hydrogen or alkyl of 1 to 10 carbon atoms, m is 2 to 10, and n is 1 to 6. The alkyl groups in this formula may be straight or branch chained. Preferably, the R groups noted in the amine will be hydrogen or alkyl of 1 to 4 carbon atoms, m will be 2 to 6 and more preferably 2 to 3 and n will be 1 to 2. Illustrative compounds of this type include, e.g., n-octylamine, 1,6-diaminohexane, diethylamine, dibutylamine, diethylene triamine, dipropylene diamine, ammonia, 1,3-propylenediamine and 1,2-propylenediamine.

The stabilized amine complex can be prepared by combining a solution of the organoboron with the amine under an inert atmosphere with cooling as needed.

The activator used as the second part or component of the initiator system will be a compound which will destabilize or liberate the free organoboron compound by removing the amine group and thereby allow the organoboron, e.g., alkylborane, to initiate the polymerization process. This activator is an aldehyde having the formula:

where R is alkyl of 1 to 10 carbon atoms, preferably 1 to 4, or aryl of 6 to 10 carbon atoms, preferably 6 to 8, and x is 1 to 2, preferably 1. In this formula, the alkyl groups may be straight or branch chained and may contain substituents such as halogen, hydroxy and alkoxy and the aryl groups may contain substituents such as halogen, hydroxy, alkoxy, alkyl and nitro. The preferred R group is aryl. Illustrative examples of compounds of this type include, benzaldehyde, o-, m- and p-nitrobenzaldehyde, 2,4-dichlorobenzaldehyde, p-tolylaldehyde and 3-methoxy-4 hydroxybenzaldehyde. Blocked aldehydes such as acetals may also be used in this invention.

Generally the initiator system of this invention will comprise the organoboron amine complex and an effective destabilizing amount of the aldehyde activator. More particularly from about 0.5:1 to 20:1 parts by weight of aldehyde to amine complex and preferably from about 2:1 to 10:1 parts by weight of aldehyde to amine complex may be used.

The organoboron initiator of this invention is particularly useful in acrylic adhesive compositions and especially solutions of elastomeric or rubber polymers in compatible polymerizable acrylic monomers.

The polymerizable acrylic monomer may be monofunctional, polyfunctional or a combination thereof.

One class of polymerizable monomers useful in the present compositions correspond to the general formula:

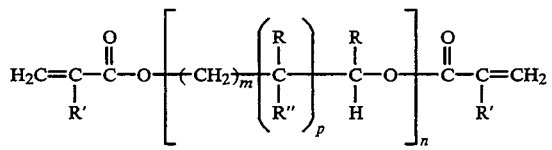

wherein
R is selected from the group consisting of hydrogen, methyl, ethyl,

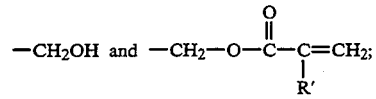

R' is selected from the group consisting of hydrogen, chlorine, methyl and ethyl;
R" is selected from the group consisting of hydrogen, hydroxy, and

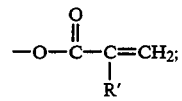

m is an integer equal to at least 1, e.g., from 1 to 8 or higher and preferably from 1 to 4 inclusive;
n is an integer equal to at least 1, e.g., from 1 to 20 or more; and
p is one of the following: 0 or 1.

Monomers useful in this invention and which come within the above general formula include, for example, ethylene glycol dimethacrylate, ethylene glycol diacrylate, polyethylene glycol diacrylate, tetraethylene glycol dimethacrylate, diglycerol diacrylate, diethylene glycol dimethacrylate, pentaerythritol triacrylate, trimethylolpropane trimethacrylate, and other polyether diacrylates and dimethacrylates.

The above class of monomers is disclosed in U.S. Pat. No. 3,043,820 issued Jul. 10, 1962 (to R. H. Krieble).

A second class of polymerizable monomers useful in the present compositions correspond to the general formula:

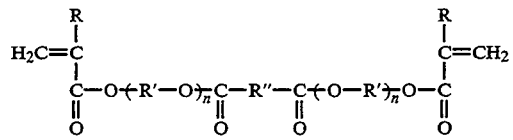

wherein
R represents hydrogen, chlorine, methyl or ethyl; R' represents alkylene with 2-6 carbon atoms; and, R" represents $(CH_2)_m$ in which m is an integer of from 0 to 8, or

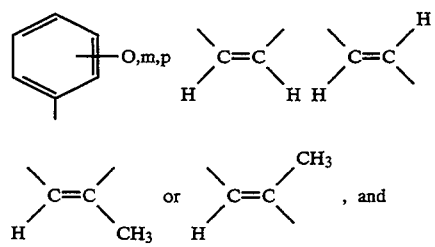

n represents an integer of from 1 to 4.
Typical monomers of this class include, for example, dimethacrylate of bis(ethylene glycol) adipate, dimethacrylate of bis(ethylene glycol) maleate, dimethacrylate of bis(diethylene glycol) phthalate, dimethacrylate of bis(tetraethylene glycol) phthalate, dimethacrylate of bis(tetraethylene glycol) sebacate, dimethacrylates of bis(tetraethylene glycol) maleate, and the diacrylates and chloroacrylates corresponding to said dimethacrylates, and the like.

The above class of monomers is disclosed in U.S. Pat. No. 3,457,212 issued Jul. 22, 1969 (Sumitomo Chemical Company, Ltd.)

Also useful herein are monomers which are isocyanate-hydroxyacrylate or isocyanate-aminoacrylate reaction products which may be characterized as acrylate terminated polyurethanes and polyureides or polyureas. These monomers correspond to the general formula:

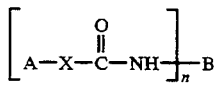

wherein

X is selected from the group consisting of —O— and

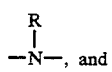

R is a member selected from the group consisting of hydrogen and lower alkyl of 1 to 7 carbon atoms; A represents the organic residue of an active hydrogen containing acrylic ester wherein the active hydrogen has been removed, the ester being hydroxy or amino substituted on the alkyl portion thereof and the methyl, ethyl and chlorine homologs thereof; n is an integer from 1 to 6 inclusive; and B is a mono- or polyvalent organic radical selected from the group consisting of alkyl, alkylene, alkenyl, cycloalkyl, cycloalkylene, aryl, aralkyl, alkaryl, poly(oxyalkylene), poly(carboalkoxyalkylene), and heterocyclic radicals both substituted and unsubstituted.

Typical monomers of this class include the reaction product of mono- or polyisocyanate, for example, toluene diisocyanate, with an acrylate ester containing a hydroxy or amino group in the non-acrylate portion thereof, for example, hydroxyethyl methacrylate.

The above class of monomers is described in U.S. Pat. No. 3,425,988 issued Feb. 4, 1969 (Loctite Corporation).

Another class of monomers useful in the present application are the mono- and polyacrylate and methacrylate esters of bisphenol type compounds. These monomers may be described by the formula:

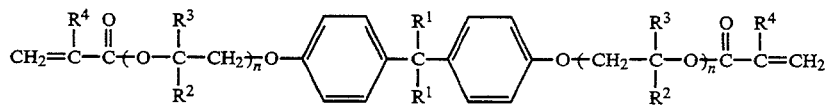

where R¹ is methyl, ethyl, carboxyalkyl or hydrogen; R² is hydrogen, methyl or ethyl; R³ is hydrogen, methyl or hydroxyl; R⁴ is hydrogen, chlorine, methyl or ethyl; and n is an integer having a value of 0 to 8.

Representative monomers of the above-described class include: dimethacrylate and diacrylate esters of 4,4'-bis-hydroxyethoxy-bisphenol A; dimethacrylate and diacrylate esters of bisphenol A; etc. These monomers are described in Japanese Patent Publication No. 70-15640 (to Toho Chemical Manuf. Ltd.).

In addition to the monomers already described, other useful monomers are monofunctional acrylate and methacrylate esters and the substituted derivatives thereof such as hydroxy, amide, cyano, chloro, and silane derivatives. Such monomers include, for example, methyl acrylate, methyl methacrylate, ethyl acrylate, ethyl methacrylate, isobornyl methacrylate, hydroxyethyl methacrylate, hydroxypropyl acrylate, hydroxypropyl methacrylate, butyl acrylate, n-octyl acrylate, 2-ethylhexyl acrylate, 2-ethylhexyl methacrylate, decylmethacrylate, dodecyl methacrylate, cyclohexyl methacrylate, tert-butyl methacrylate, acrylamide, N-methylolacrylamide, diacetone acrylamide, N-tert-butyl acrylamide, N-tert-octyl acrylamide, N-butoxyacrylamide, gamma-methacryloxypropyl trimethoxysilane, 2-cyanoethyl acrylate, 3-cyanopropyl acrylate, tetrahydrofurfuryl methacrylate, phenoxyethyl methacrylate, tetrahydrofurfuryl chloroacrylate, isobornyl acrylate, isobornyl methacrylate, glycidyl acrylate, glycidyl methacrylate, and the like.

The monomers useful herein are seen to be polymerizable monomers having one or more acrylic or substituted acrylic groups as a common, unifying characteristic, and for convenience may be generically termed acrylic monomers.

The elastomer or rubber polymers may be any of the typically available synthetic rubbers that are soluble in the monomer such as those based on polyisoprenes, polybutadienes, polyolefins, polyurethane, polyesters, etc. Examples of elastomeric materials include homopolymers such as polybutadiene, polyisoprene and polyisobutylene; diene type block copolymers such as styrene/butadiene/styrene and styrene/isoprene/styrene; and graft or random copolymers such as butadiene/styrene copolymer, butadiene/acrylonitrile copolymer, butadiene/methyl methacrylate copolymer and butadiene/alkyl acrylate copolymer; ethylene/vinyl acetate copolymers; ethylene/alkyl acrylate copolymers (1-8 carbons in the alkyl group), rubbery polyalkyl acrylates or copolymers thereof; polyurethane; chlorinated polyethylenes; and EPDM (ethylene/propylene/diene terpolymers).

The elastomers of these structures may contain a functional group at one or both ends or within a particular segment or repeating unit of the copolymer. Among the suitable functional groups are vinyl, epoxy, carboxyalkyl, and mercapto groups. Other functional groups may be employed as deemed useful as determined by routine experimentation.

One preferred group of elastomers are the block copolymers. Several such block copolymers are manufactured by Shell Chemical Company under the tradename Kraton and by Firestone under the tradename Stereon. In particular, Stereon 840A, a poly(styrene-b-butadiene-b-styrene) block copolymer, has been found to be especially useful in the instant adhesive composition. Other preferred block copolymers of this type are available under the tradename Solprene 416, manufactured by Phillips Petroleum Co.

The monomer solution containing the elastomer or rubbery polymer is commonly prepared by dissolving the elastomer in the monomer, which may be in the form of a syrup. In some cases, the monomer solution may be prepared by extracting a rubbery polymer from a latex of the rubbery polymer in water, as used for suspension polymerization, and then dissolving in the monomer.

The amount of the acrylic monomer to be used in this invention may vary somewhat depending on the specific properties desired but generally about 10 to 90% by weight of the composition and preferably about 15 to 80% by weight is used. Adjustment within these ranges are easily made within the skill of the art. The elastomer is generally present in amounts of about 5 to 80% by weight and preferably about 20 to 60% by weight of the composition.

The second part of the initiator which contains the aldehyde activator, preferably may also contain a peroxy or hydroperoxy component having the formula:

R—OOH where R is hydrogen, alkyl of 1 to 10 preferably 4 to 10 carbon atoms or aryl or alkaryl of 6 to 14, preferably 6 to 10 carbon atoms. Illustrative compounds of this type are t-butyl hydroperoxide and cumene hydroperoxide. Typically these hydroperoxy compounds which aid in the initiation of polymerization are used in the initiator system in amounts of about 0.2:1 to 100:1 and preferably from about 0.4:1 to 20:1 parts by weight of hydroperoxy to amine complex.

The organoboron amine complex used in an adhesive composition in accordance with this invention generally comprises from about 0.1 to 5% by weight of the total composition and preferably from about 0.5 to 2.5% and the aldehyde activator comprises from about 0.5 to 10.0%, preferably from about 2.0 to 5.0% by weight of the total composition. When a hydroperoxy compound is used in the adhesive composition, it generally comprises from about 0.2 to 10% by weight of the total composition and preferably from about 0.5 to 2%.

Other additives useful in elastomeric acrylic adhesives of this type, such as adhesion promoters, chelators, cross-linking agents, inhibitors, activators such as N,N-dimethyltoluidine and pyridine or substituted pyridines as well as thickeners, plasticizers and diluents may also be used in the adhesive compositions of this invention.

The organoboron initiator system as described above comprises a two component system. When used in the acrylic rubber compositions of this invention generally the two parts are mixed in equal quantities of the monomer-polymer solution, but this may vary at the discretion of the user. That is, the stabilized organoboron compound is added to a solution of the elastomer or rubber polymer dissolved in the polymerizable acrylic monomer and the aldehyde activator and optional hydroperoxy compound are added as a second part which also may be in a solution of the rubber polymer in acrylic monomer.

Adhesive compositions of this invention are particularly useful in structural and semi-structural applications such as speaker magnets, metal-metal bonding (automotive) glass-metal bonding, glass-glass bonding, circuit board component bonding, selected plastic to metal, glass, wood, etc. and electric motor magnets.

In the following examples, which are merely illustrative of the embodiments of this invention, all parts and percentages are given by weight and all temperatures are in degrees Celsius unless otherwise noted.

EXAMPLE I

Preparation of Organoboron Amine Complexes

Into a 3-neck flask containing a stirrer, condenser, thermometer and a nitrogen purge, 7.8 g (0.105 mole; 5% excess) of 1,3-propylene diamine was added and the nitrogen purge continued while 100 ml of 1 molar solution (0.1 mole) of triethylboron in tetrahydrofuran was further added. A mild exotherm developed and the temperature was kept below about 40° C. by cooling as necessary. When the addition was complete, the mixture was stirred for about 0.5 hour and transferred to a bottle previously flushed with nitrogen. This amine complex, triethylboron-1,3-propane diamine complex was used in the following example to illustrate the effective use of such organoboron amine complexes in adhesive formulations when using different aldehyde activators.

EXAMPLE II

Preparation of Adhesive Composition

An adhesive formulation was prepared consisting of two parts that were mixed just prior to use. The first part contained the monomer-polymer syrup and the stabilized organoboron amine complex initiator from Example I. The second part contained a similar monomer-polymer syrup and an aldehyde activator or reagent that destabilized the organoboron amine complex liberating the free organoboron. When mixed with the first part polymerization was initiated. The two adhesive composition parts were:

| Part I | |
|---|---|
| Stereon 840A (styrene-butadiene block copolymer) | 25 parts |
| Isobornyl methacrylate | 60 parts |
| 2-ethylhexyl methacrylate | 15 parts |
| triethylboron-1,3-propane diamine complex | 1 part |
| Part II | |
| Stereon 840A | 25 parts |
| Tetrahydrofurfuryl methacrylate | 50 parts |
| 2-ethylhexyl methacrylate | 20 parts |
| 2-hydroxypropyl methacrylate | 5 parts |
| Cumene hydroperoxide (CHP) | 1 part |
| Aldehyde (see table) | 1–5 parts |

Approximately equal portions of Parts I and II were mixed and applied to steel plates and allowed to cure. The gellation (curing) time, tensile shear strength measurement using ASTM standard method D1002-72(1973) in pounds/inch$^2$ (psi) and the T-peel strength using ASTM standard method D-1876-72 in pounds/linear inch (pli) were determined for the respective formulations as shown below.

| Aldehyde (%) | Gel Time (Min.) | Tensile Shear (psi) | T-peel (pli) |
|---|---|---|---|
| Benzaldehyde (1.0) | 32 | 1000 | 14.9 |
| Benzaldehyde (1.5) | 13 | 1950 | 10.8 |
| Benzaldehyde (2.0) | 10 | 1800 | 4.7 |
| Benzaldehyde (2.5) | 17 | 1600 | 4.2 |
| Benzaldehyde (3.0) | 14 | 1500 | 13.0 |
| Benzaldehyde (5.0) | 8 | 1100 | 14.5 |
| O—NB (2.0) | 12 | — | — |
| m-NB (2.0) | 8 | — | — |
| p-NB (2.5) | >15 | 1700 | 4.2 |
| 2,4-DCB (2.0) | 3 | — | — |
| Vanillin (2.0) | 2 | — | — |
| Control 1 (0%) | No cure | — | — |

| Aldehyde (%) | Gel Time (Min.) | Tensile Shear (psi) | T-peel (pli) |
|---|---|---|---|
| Control 2 (10% acid) | 0.75 | 2000 | 20 |

O—NB = ortho-nitrobenzaldehyde
m-NB = meta-nitrobenzaldehyde
p-NB = pare-nitrobenzaldehyde
2,4-DCB = 2,4-dichlorobenzaldehyde
vanillin = 3-methoxy-4-hydroxybenzaldehyde
Control 1 = no aldehyde use
Control 2 = methacrylic acid used in place of aldehyde These results display the desired adhesive properties of tensile shear and T-peel strength and also show desired cure rates of several minutes duration in comparison with the fast curing acid containing formulation (Control 2).

What is claimed is:

1. A two-part initiator composition comprising:
   A) a stabilized organoboron amine complex of the formula:

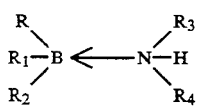

where R, $R_1$ and $R_2$ are alkyl of 1 to 10 carbon atoms or phenyl, $R_3$ and $R_4$ are hydrogen or alkyl of 1 to 10 carbon atoms, or

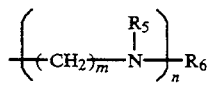

or

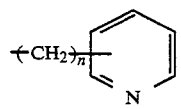

where $R_5$ and $R_6$ are hydrogen or alkyl of 1 to 10 carbon atoms, m is 2 to 10 and n is 1 to 6, and
   B) an effective destabilizing amount of an aldehyde activator having the formula:

where R is alkyl of 1 to 10 carbon atoms or aryl of 6 to 10 carbon atoms and x is 1 to 2.

2. The composition of claim 1 wherein in the organoboron amine complex, R, $R_1$ and $R_2$ are alkyl of 1 to 4 carbons, $R_3$, $R_4$ and $R_5$ are hydrogen or alkyl of 1 to 4 carbon atoms, $R_6$ is hydrogen, m is 2 to 6 and n is 1 to 2.

3. The composition of claim 2 wherein the R group of the aldehyde of Part B is an alkyl group of 1 to 4 carbons or an aryl of 6 to 8 carbons and x is 1.

4. The composition of claim 3 wherein the R group of the aldehyde is an aryl group and wherein from about 0.5:1 to 20:1 parts by weight of aldehyde to amine complex are used.

5. The composition of claim 4 wherein the second part B also contains a hydroperoxy compound.

6. The composition of claim 5 wherein the hydroperoxy compound has the formula R—OOH, where R is hydrogen, alkyl of 1 to 10 carbon atoms or aryl or alkaryl of 6 to 14 carbon atoms.

7. The composition of claim 5 wherein the complex is a combination of triethyl boron and ethylene diamine or propylene diamine.

* * * * *